United States Patent
Wang et al.

(10) Patent No.: US 7,109,082 B2
(45) Date of Patent: Sep. 19, 2006

(54) FLASH MEMORY CELL

(75) Inventors: Leo Wang, Hsinchu (TW);
Cheng-Tung Huang, Kaohsiung (TW);
Saysamone Pittikoun, Hsinchu (TW)

(73) Assignee: Powerchip Semiconductor Corp., Hsinchu (TW)

(*) Notice: Subject to any disclaimer, the term of this patent is extended or adjusted under 35 U.S.C. 154(b) by 0 days.

(21) Appl. No.: 10/905,189

(22) Filed: Dec. 21, 2004

(65) Prior Publication Data
US 2006/0008981 A1    Jan. 12, 2006

(30) Foreign Application Priority Data
Jul. 8, 2004    (TW) .............................. 93120432 A

(51) Int. Cl.
*H01L 21/336*    (2006.01)
(52) U.S. Cl. .................. 438/257; 438/250; 438/253
(58) Field of Classification Search ................ None
See application file for complete search history.

(56) References Cited

U.S. PATENT DOCUMENTS

| | | | |
|---|---|---|---|
| 2002/0012745 A1* | 1/2002 | Kanamori | 427/96 |
| 2002/0167041 A1* | 11/2002 | Tseng | 257/315 |
| 2004/0048482 A1* | 3/2004 | Tseng | 438/706 |
| 2005/0173756 A1* | 8/2005 | Kim et al. | 257/316 |

* cited by examiner

*Primary Examiner*—Thao P. Le
(74) *Attorney, Agent, or Firm*—Jianq Chyun IP Office

(57) ABSTRACT

A flash memory cell including a first conductive type substrate, a second conductive type well, a patterned film layer, a second conductive type doped region, a tunneling dielectric layer, a plurality of floating gates, an inter-gate dielectric layer and a plurality of control gates is provided. The floating gates are formed on the first conductive type substrate outside the patterned film layer. The floating gates have a thickness greater than the patterned film layer. Thus, the overlapping area between the floating gates and the control gates and hence the coupling ratio of the flash memory cell is increased.

15 Claims, 16 Drawing Sheets

FLASH MEMORY CELL

CROSS-REFERENCE TO RELATED APPLICATION

This application claims the priority benefit of Taiwan application serial no. 93120432, filed on Jul. 8, 2004.

BACKGROUND OF THE INVENTION

1. Field of the Invention

The present invention relates to a memory device and a fabricating method thereof. More particularly, the present invention relates to a flash memory cell and a fabricating method thereof.

2. Description of the Related Art

Non-volatile memory is currently used inside many types of electronic devices for holding structural, program and other repeatedly accessible data. Flash memory is one type of non-volatile memory that can be repeatedly accessed. In fact, flash memory is a type of electrically erasable programmable read only memory (EEPROM) device that allows multiple data writing, reading and erasing operations. Furthermore, the stored data will be retained even after power to the device is removed. With these advantages, flash memory has been broadly applied in personal computer and electronic equipment.

FIG. 1 is a diagram showing a schematic layout of the conventional flash memory cells. FIGS. 2A through 2C are schematic cross-sectional views along line I–I' of FIG. 1 showing the steps for fabricating a conventional memory cell. FIG. 3A is a schematic cross-sectional view along line II–II' of FIG. 1 showing the corresponding memory cell structure in FIG. 2A. FIG. 3B is a schematic cross-sectional view along line II–II' of FIG. 1 showing the corresponding memory cell structure in FIGS. 2B and 2C.

As shown in FIGS. 2A and 3A, a plurality of linear device isolation structures 102 is formed on a substrate 100. Using the device isolation structure 102 as a mask, a well region 104 and doped region 106 are formed in the substrate 100. Thereafter, a tunneling dielectric layer 108 is formed over the doped region 106 of the substrate 100. A patterned conductive layer 110 is formed over the tunneling dielectric layer 108. The patterned conductive layer 110 has a plurality of linear strips aligned in parallel to each other.

As shown in FIGS. 2B and 3B, an inter-gate dielectric layer 112 is formed over the substrate 100 and the patterned conductive layer 110. Thereafter, a conductive layer 114 is formed over the inter-gate dielectric layer 112. As shown in FIGS. 2C and 3B, the conductive layer 114, the inter-gate dielectric layer 112 and the patterned conductive layer 110 are patterned in the same processing step to form a plurality of linear control gates 114a and linear floating gates 110a and expose the substrate 100 on each side of the floating gates 110a. Thereafter, a doped region 116 is formed in the substrate 100 on each side of the floating gates 110a to serve as the source/drain regions of the flash memory cell. Meanwhile, the doped region 106 between the neighboring doped regions 116 serves as the channel region of the flash memory cell.

At present, semiconductor fabrication techniques have been developing towards the production devices having a higher level of integration and a smaller dimension. In the process of miniaturizing semiconductor devices, many types of technical difficulties are encountered. Using the aforementioned process of fabricating a conventional flash memory cell as an example, the overlapping area between the floating gate 110a and the control gate 114a must be increased to produce a higher coupling ratio when the dimension of each memory cell is reduced. Thus, the floating gate 110a must have a sufficient thickness and the distance separating two neighboring floating gates 110 over the device isolation structure 102 must be as small as possible. In other words, the patterned conductive layer 110 in FIG. 3A must have a definite minimum thickness and the opening 113 must have a dimension as small as possible. To meet these criteria, the aspect ratio of the openings 113 in the patterned conductive layer 110 is very high rendering the process of etching the patterned conductive layer 110 extremely difficult.

Furthermore, in the etching process for forming the control gates 114a and the control gates 110a, the etching period is frequently extended in order to remove any trace of residual inter-gate dielectric layer 112. This often causes an over-etching of the device isolation structures 102 leading to a possible increase in the leakage current from the device. Ultimately, the electrical performance of the devices is likely to deteriorate.

SUMMARY OF THE INVENTION

Accordingly, at least one objective of the present invention is to provide a method of fabricating a flash memory cell that can ease the processing requirements and increases the reliability of the memory device.

At least a second objective of the present invention is to provide a flash memory cell having a higher coupling ratio so that data can be read from the memory or erased from the flash memory cell faster.

To achieve these and other advantages and in accordance with the purpose of the invention, as embodied and broadly described herein, the invention provides a method of fabricating a flash memory cell. First, a first conductive type substrate is provided. The first conductive type substrate has a second conductive type well and a plurality of device isolation structures already formed thereon. The device isolation structures are disposed at the second conductive type well for defining active regions on the first conductive type substrate. Thereafter, a first conductive type doped region is formed inside the second conductive type well at the active region. A patterned film layer is formed over the first conductive type substrate. The patterned film layer has a plurality of openings that exposes a portion of the first conductive type doped region.

Next, a second conductive type doped region is formed in the first conductive type substrate exposed by the plurality of openings in the patterned film layer. Thereafter, a tunneling dielectric layer is formed over the exposed first conductive type substrate. A floating gate is formed over the tunneling dielectric layer inside each opening and then a portion of the patterned film layer is removed to reduce its thickness to a value smaller than the thickness of he floating gate. After that, an inter-gate dielectric layer is formed over the patterned film layer to cover the floating gates. A plurality of control gates is formed over the inter-gate dielectric layer such that each control gate is stacked over a floating gate.

In the present invention, a patterned film layer with openings therein is formed over the substrate and then conductive material is deposited into the openings to form the floating gate. Since the floating gate is not formed in an etching operation, the difficulties of producing an opening with a large aspect ratio for accommodating the floating gate of the flash memory cell can be avoided.

The present invention also provides a flash memory including a first conductive type substrate, a second conductive type well, a plurality of device isolation structures, a first conductive type doped region, a patterned film layer, a tunneling dielectric layer, a plurality of floating gates, an inter-gate dielectric layer and a plurality of linear control gates. The second conductive type well is disposed in the first conductive type substrate and the device isolation structures are disposed on the first conductive type substrate. The device isolation structures define an active region on the first conductive type substrate. The first conductive type doped region is disposed in the second conductive type well within the active region. The patterned film layer is disposed on a portion of the first conductive type substrate.

The tunneling dielectric layer is disposed on a portion of the first conductive type substrate exposed by the patterned film layer. The floating gates are disposed on the tunneling dielectric layer. The floating gates have a thickness greater than the patterned film layer. The inter-gate dielectric layer is disposed on the floating gate to cover the patterned film layer. The control gates are stacked above the respective floating gates on the inter-gate dielectric layer.

Since the thickness of the floating gate in the flash memory cell is not limited by the need to perform an etching operation, the floating gate can have a greater thickness for boosting the coupling ratio of the flash memory cell.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
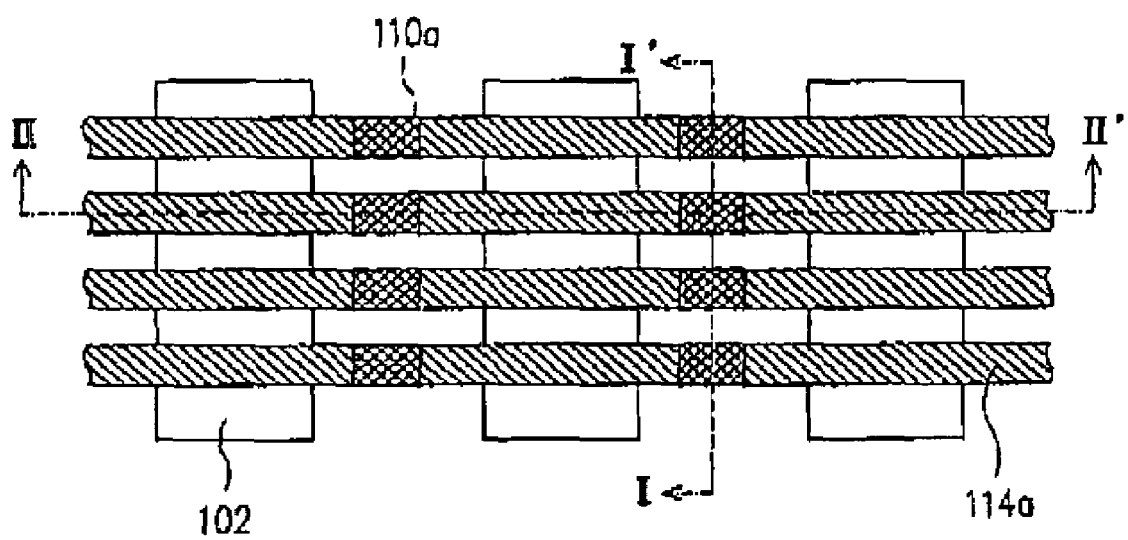
FIG. 1 is a diagram showing a schematic layout of the conventional flash memory cells.
Figure 2A:
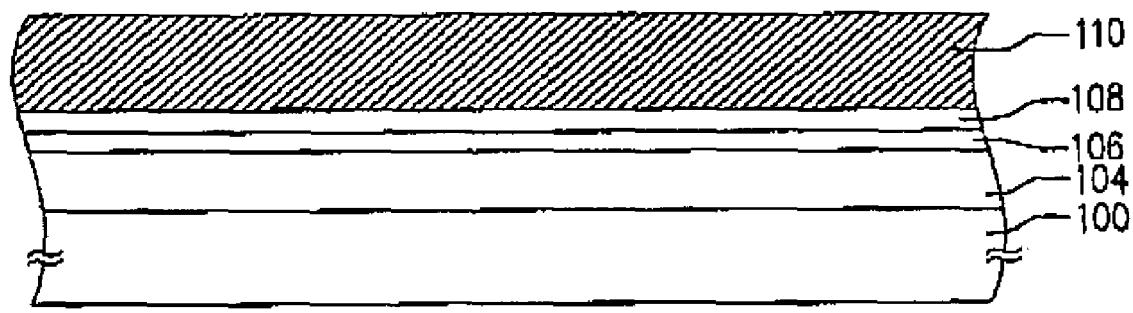
FIGS. 2A through 2C are schematic cross-sectional views along line I–I' of FIG. 1 showing the steps for fabricating a conventional memory cell.
Figure 2B:
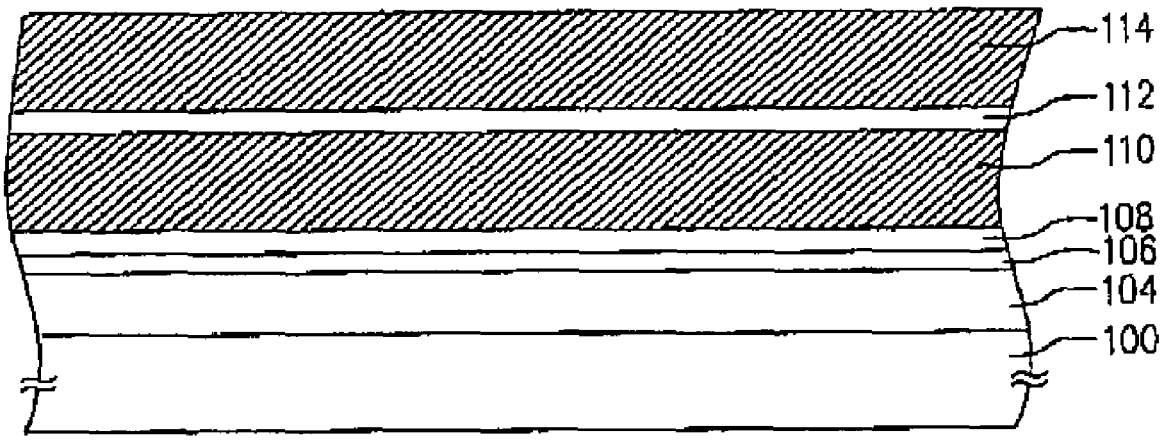
Figure 2C:
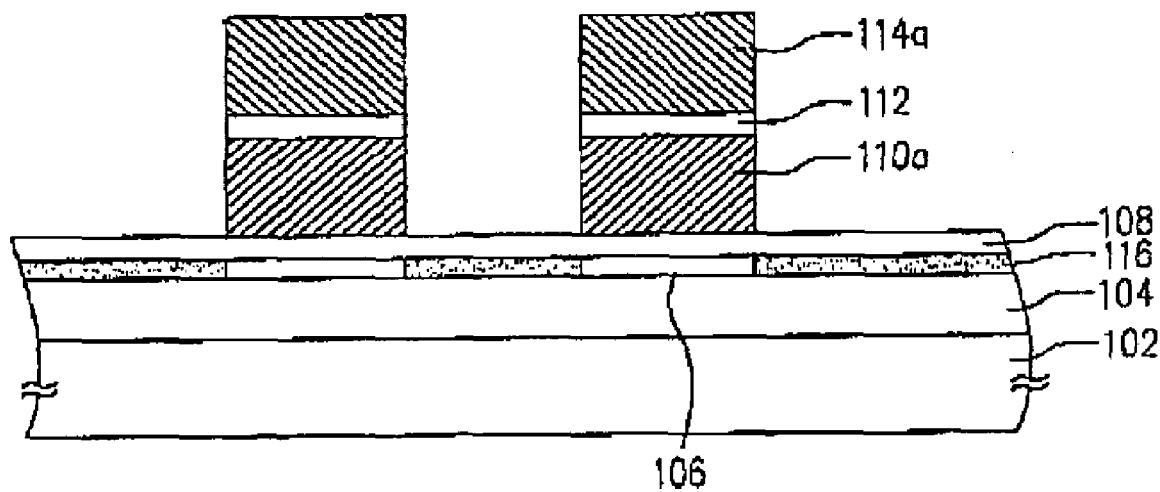
Figure 3A:
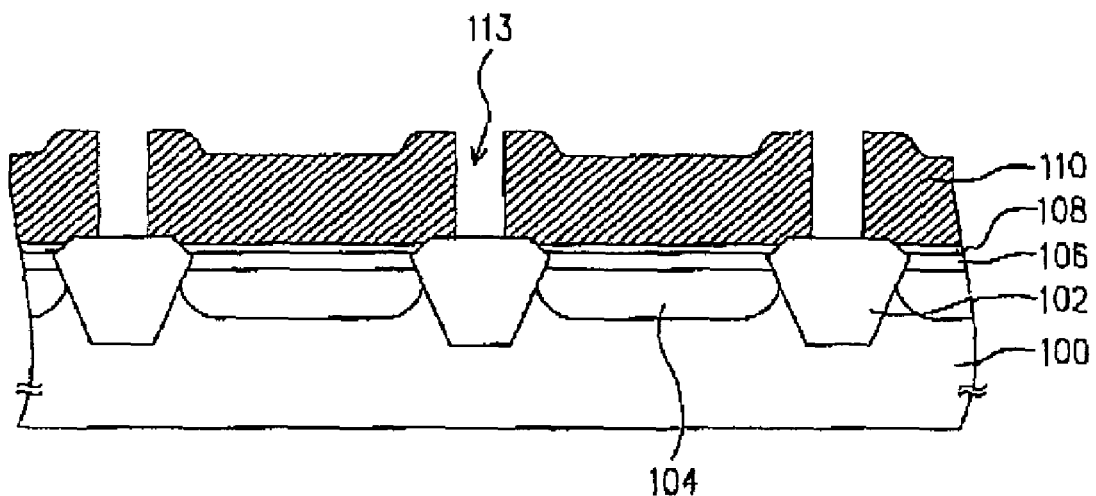
FIG. 3A is a schematic cross-sectional view along line II–II' of FIG. 1 showing the corresponding memory cell structure in FIG. 2A.
Figure 3B:
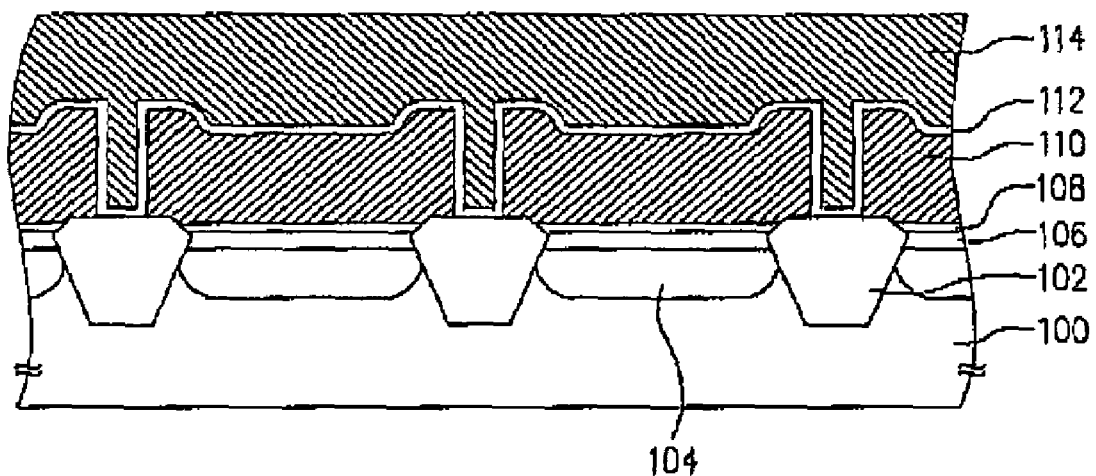
FIG. 3B is a schematic cross-sectional view along line II–II' of FIG. 1 showing the corresponding memory cell structure in FIGS. 2B and 2C.

Reference will now be made in detail to the present preferred embodiments of the invention, examples of which are illustrated in the accompanying drawings. Wherever possible, the same reference numbers are used in the drawings and the description to refer to the same or like parts.

In the following embodiment of the present invention, the first conductive type is the n-type and the second conductive type is the p-type. However, anyone familiar with the technique may noticed that it is equally feasible to implement using the p-type as the first conductive type and the n-type as the second conductive type.

Figure 4:
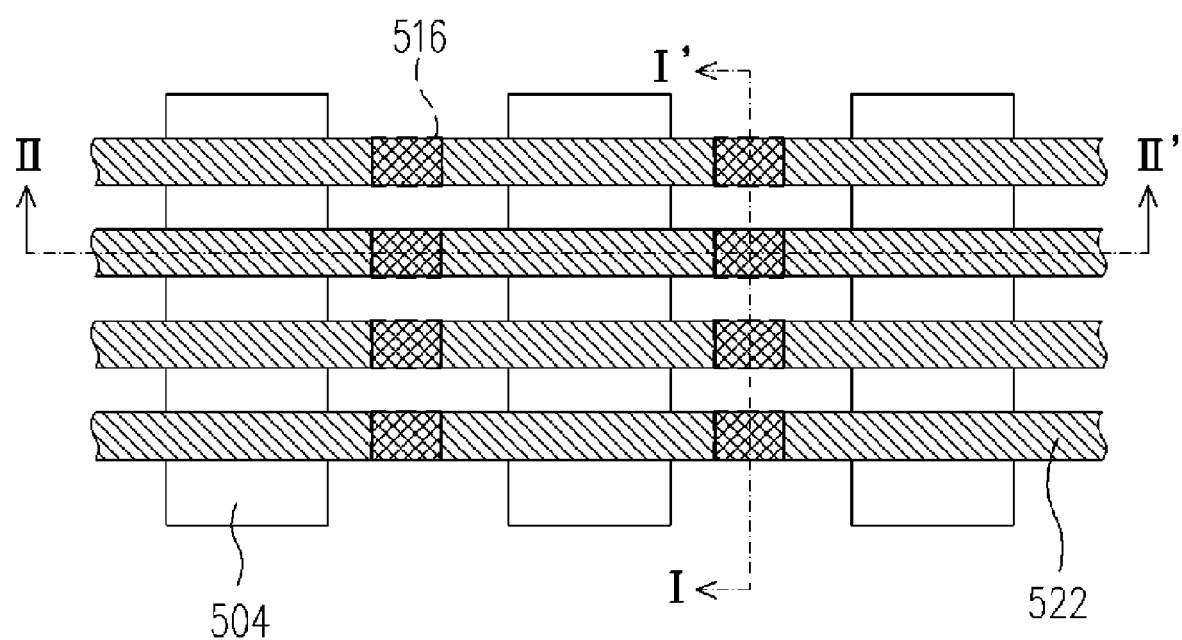
FIG. 4 is a top view showing the layout of memory cells in a flash memory according to the present invention.

FIG. 4 is a top view showing the layout of memory cells in a flash memory according to the present invention. FIGS. 5A through 5D are schematic cross-sectional views along line I–I' of FIG. 4 showing the steps for fabricating a memory cell according to the present invention. FIGS. 6A through 6D are schematic cross-sectional views along line II–II' of FIG. 4, which also correspond to FIGS. 5A through 5D, showing the steps for fabricating a memory cell according to the present invention.

Figure 5A:
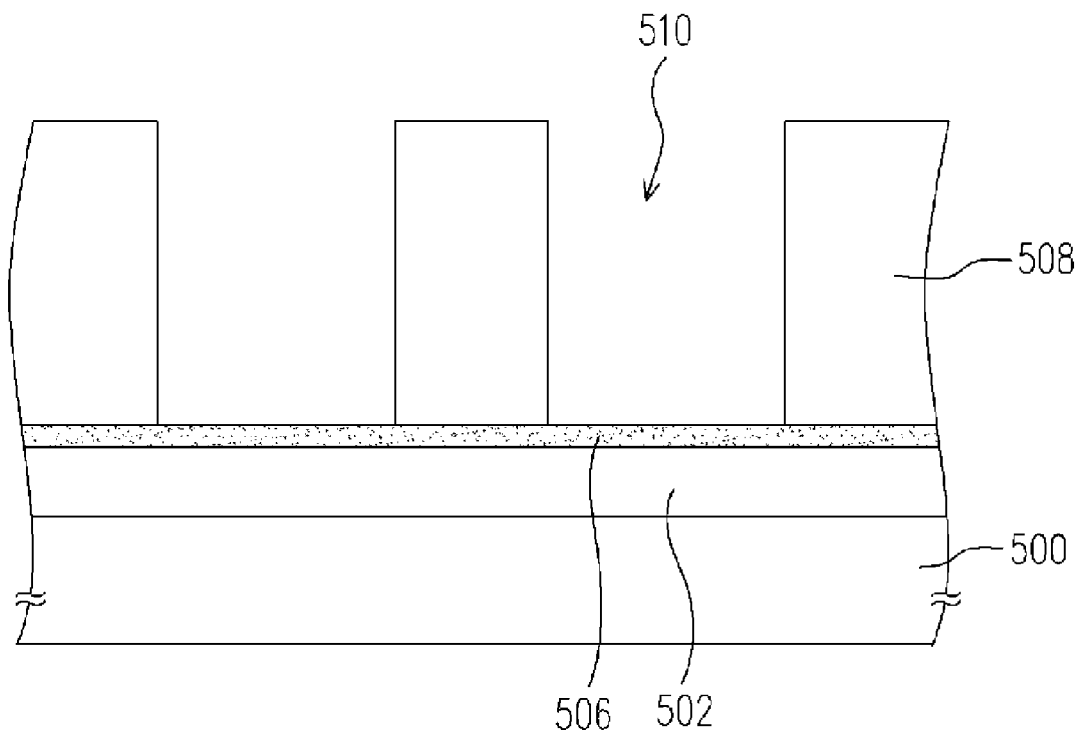
FIGS. 5A through 5D are schematic cross-sectional views along line I–I' of FIG. 4 showing the steps for fabricating a memory cell according to the present invention.
Figure 6A:
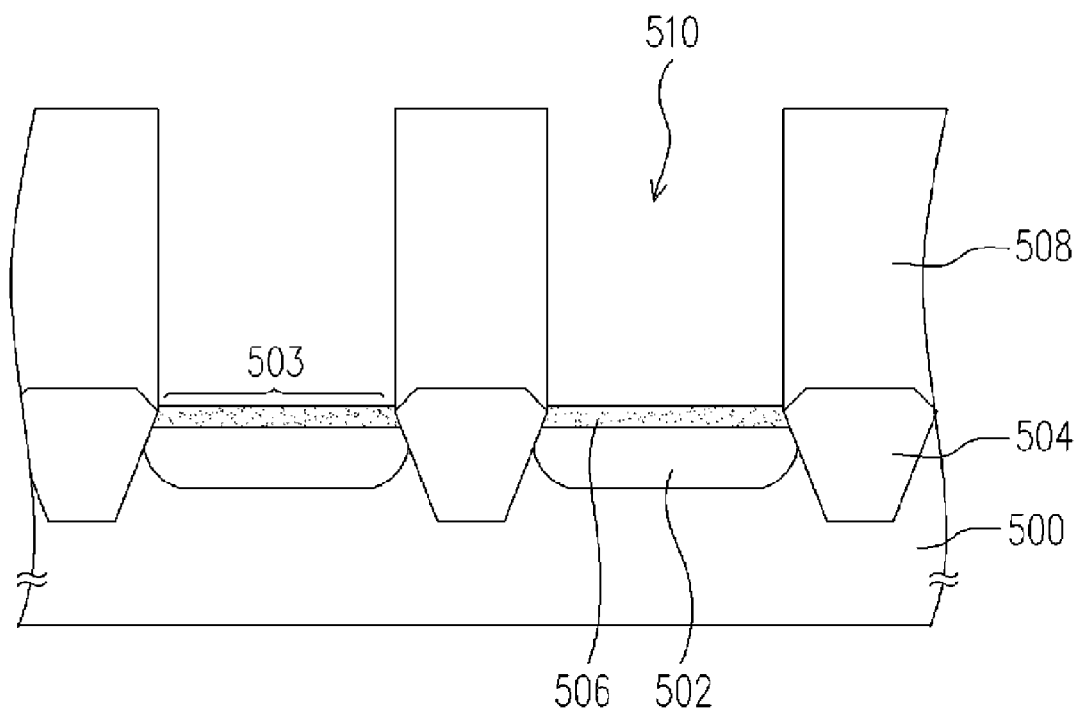
FIGS. 6A through 6D are schematic cross-sectional views along line II–II' of FIG. 4, which also correspond to FIGS. 5A through 5D, showing the steps for fabricating a memory cell according to the present invention.

As shown in FIGS. 5A and 6A, a plurality of linear device isolation structures 504 (shown in FIG. 6A) is formed on an n-type substrate 500 to define an active region 503 for the memory device. A p-type well 502 is formed in the n-type substrate 500 within the active region 503. The device isolation structures 504 are formed, for example, by performing a shallow trench isolation process or a local oxidation (LOCOS). Thereafter, an n-doped region 506 is formed in the p-type well 502 within the active region 503. The n-doped region 506 is used as the source/drain region of the flash memory cell in a subsequent operation. A patterned film layer 508 is formed over the n-type substrate 500. The patterned film layer 508 is, for example, a silicon oxide layer having a plurality of openings 510 that exposes a portion of the n-doped region 506 within the active region 503. The patterned film layer 508 is formed, for example, by depositing material such as silicon oxide over the n-type substrate 500 to form a material layer (not shown) in a chemical vapor deposition (CVD) process and then performing a photolithographic and etching process to form the openings 510 in the patterned film layer 508.

Figure 5B:
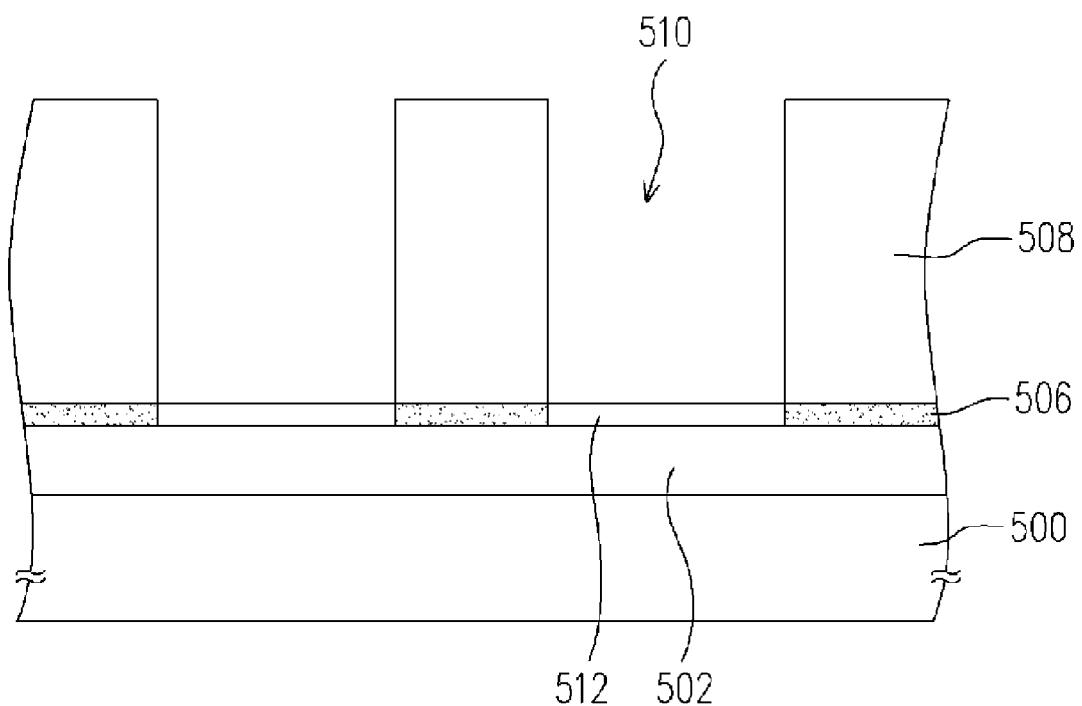
Figure 6B:
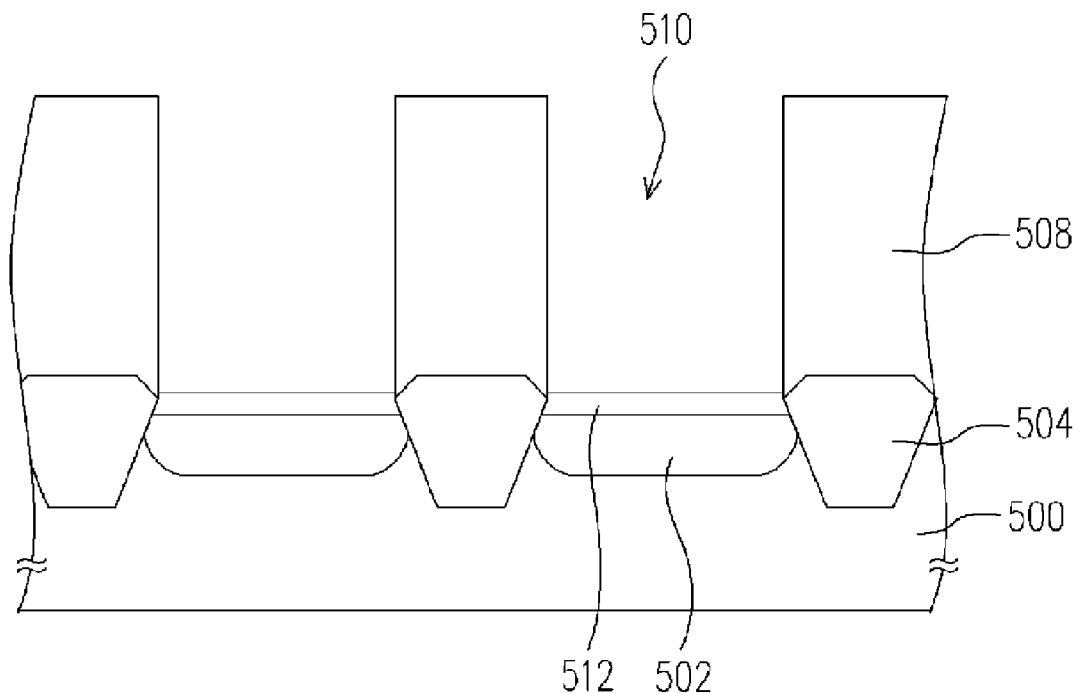

As shown in FIGS. 5B and 6B, a p-type doped region 512 is formed in the exposed n-type doped region 506. The p-type doped region 512 is used as the channel region of the flash memory cell in a subsequent operation. The p-type doped region 512 is formed, for example, by implanting p-type ions into the n-type doped region 506 through the openings 510 using the patterned film layer 508 as a mask.

Figure 5C:
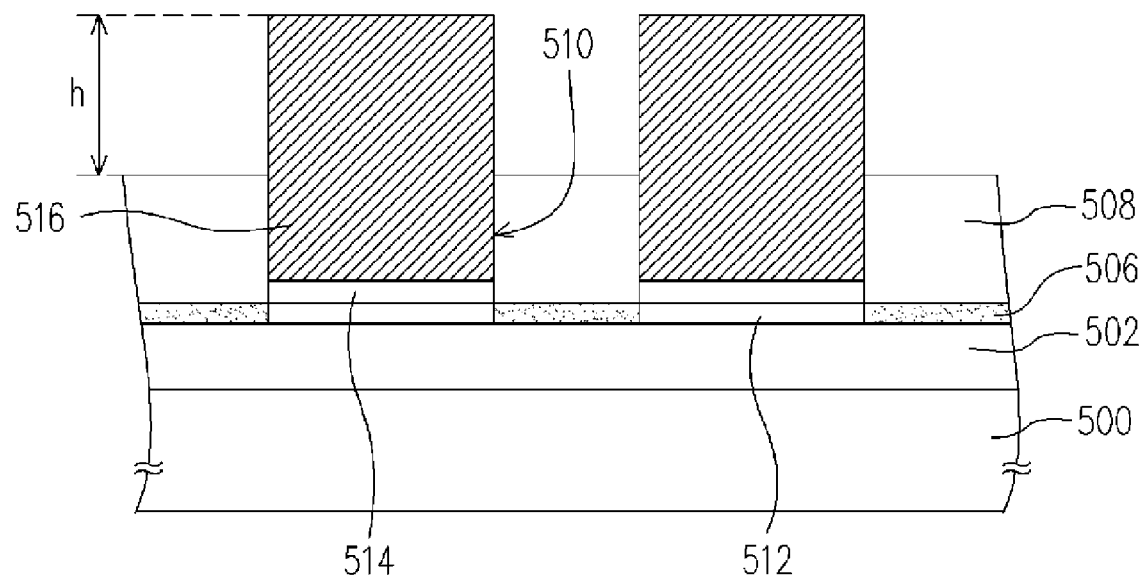
Figure 6C:
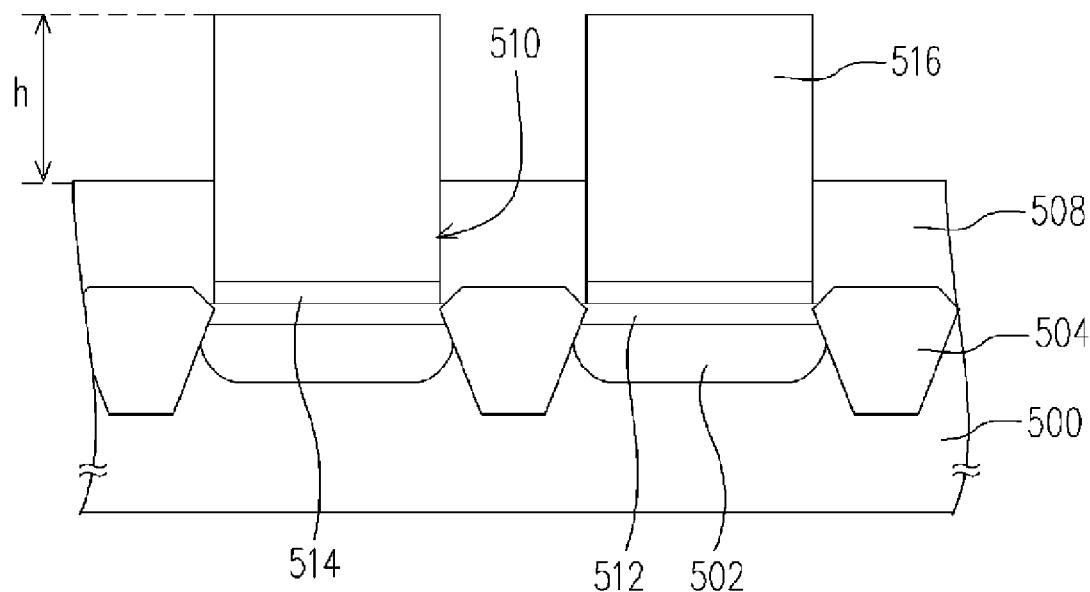

As shown in FIGS. 5C and 6C, a tunneling dielectric layer 514 is formed over p-type doped region 512 of the n-type substrate 500. The tunneling dielectric layer 514 is a silicon oxide layer formed, for example, by performing a thermal oxidation. Thereafter, a floating gate 516 is formed over the tunneling dielectric layer 514 within the each opening 510.

Figure 7A:
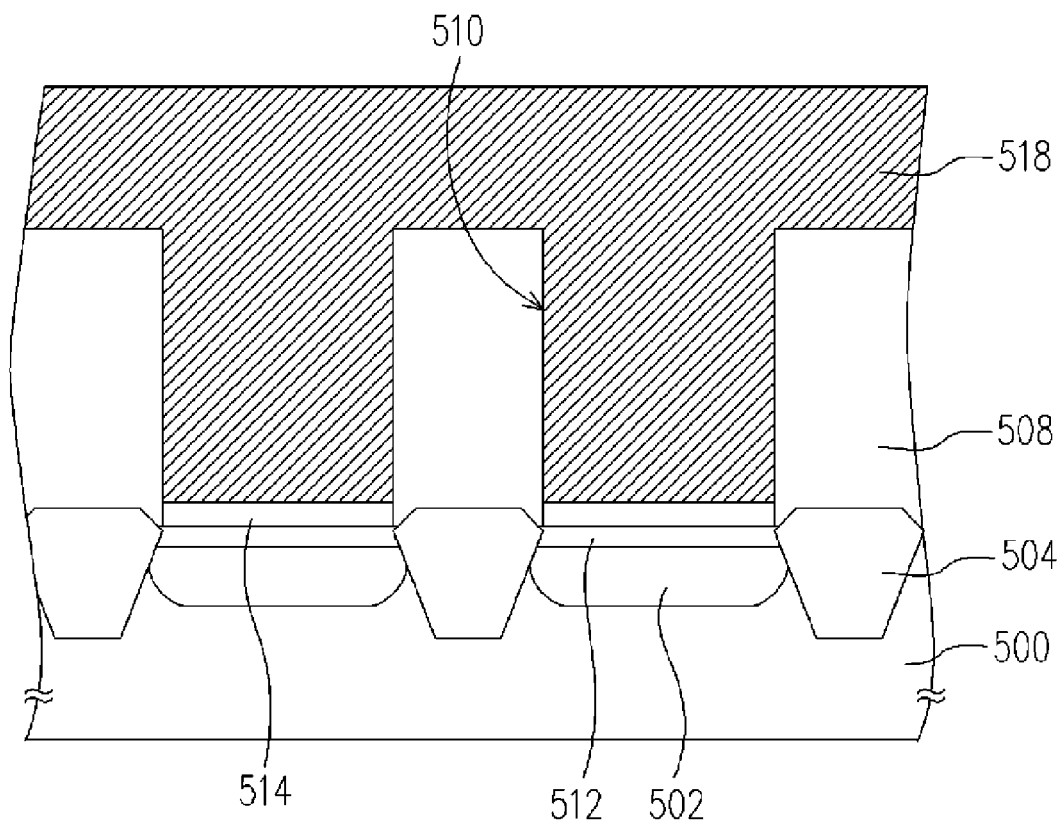
FIGS. 7A and 7B are schematic cross-sectional views along line II–II' of FIG. 4 showing the steps for fabricating the floating gate of the flash memory cell according to the present invention.
Figure 7B:
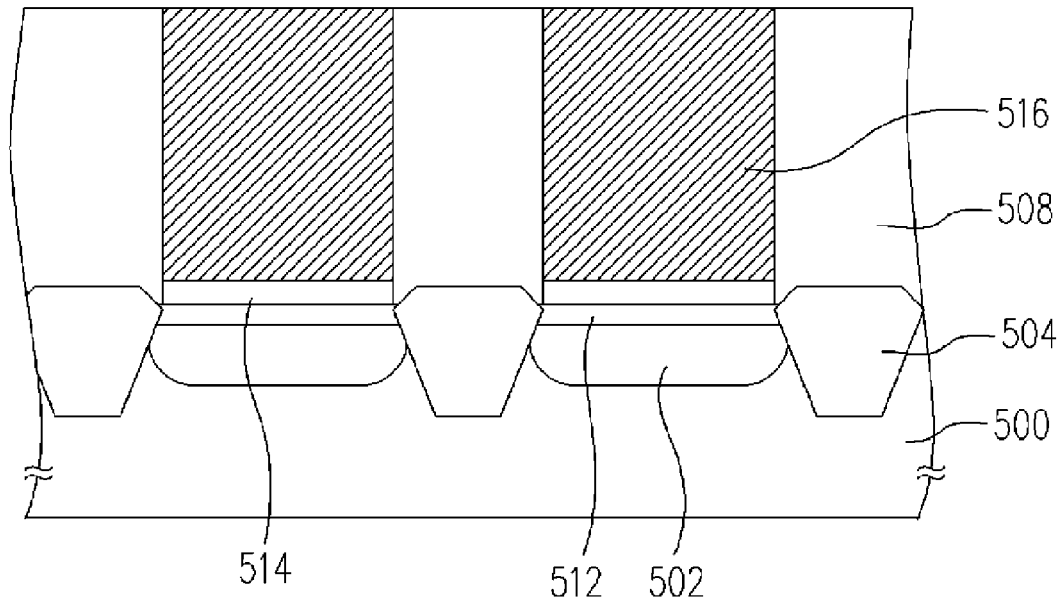

FIGS. 7A and 7B are schematic cross-sectional views along line II–II' of FIG. 4 showing the steps for fabricating the floating gate of the flash memory cell according to the present invention. In a preferable embodiment, a conductive layer 518 (shown in FIG. 7A) is formed over the patterned film layer 508 and the n-type substrate 500 completely filling the openings 510. The conductive layer 518 is a doped polysilicon layer formed, for example, by performing a chemical vapor deposition process. Thereafter, the conductive layer 518 is planarized in a chemical-mechanical polishing operation using the patterned film layer 508 as a polishing stop layer or in an etching operation using the patterned film layer 508 as an etching stop layer. Hence, a portion of the conductive layer 51 8 is removed to expose the patterned film layer 508 and form a plurality of floating gates 516 as shown in FIG. 7B. Next, the patterned film layer 508 is etched back. Because of the etching selectivity between material constituting the patterned film layer 508 and the floating gate 516, a portion of the patterned film layer 508 can be removed without damaging the floating gates 516. Hence, the patterned film layer 508 has a smaller thickness than the floating gates 516 as shown in FIGS. 5C and 6C. Typically, the floating gates 51 6 have an average thickness of about 5000 Å while the patterned film layer 508 has a thickness between about 1500 Å to 2000 Å. It should be noted that the difference in height h (the extent of the floating gate 516 protruding above the patterned film layer 508 from the opening 510) between the floating gate 516 and the patterned film layer 508 determines the coupling ratio of a flash memory cell. In other words, the higher the value of h, the coupling ratio of the flash memory cell will be greater and the data accessing and erasing rate will be faster.

It should be noted that the present invention does not restrict the method of forming the floating gates 516 to the one (as shown in FIGS. 7A and 7B) above. Anyone familiar with the technique of production may choose other suitable means of forming the floating gates 516 shown in FIGS. 5C and 6C.

Figure 5D:
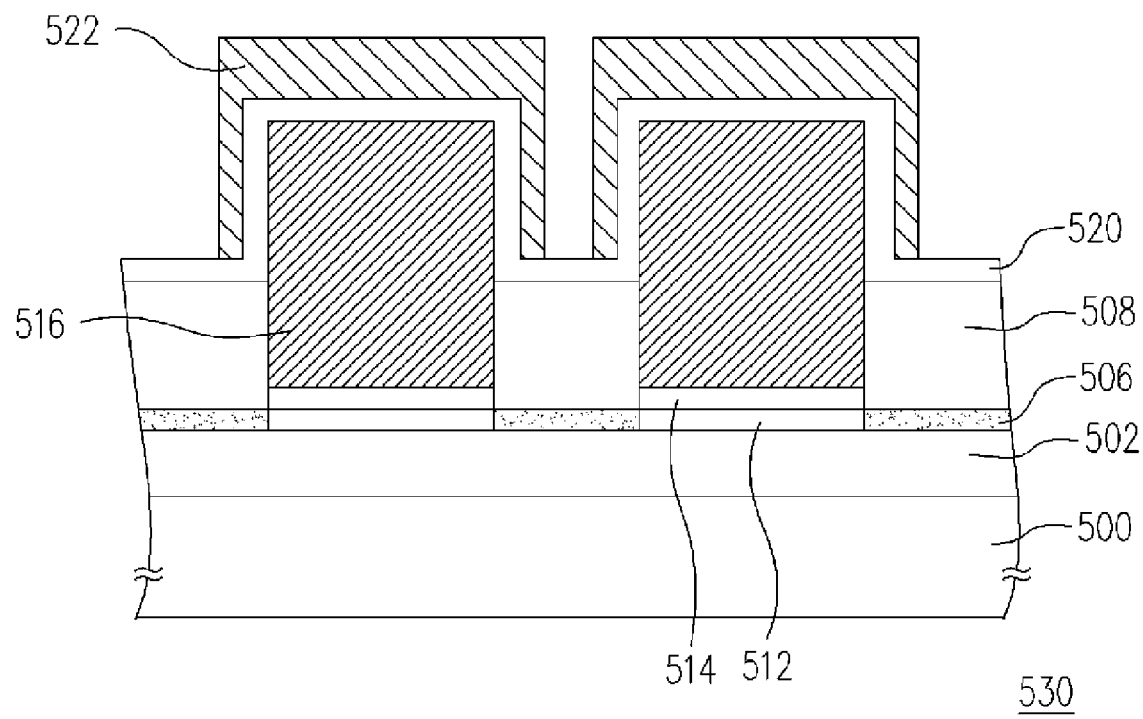
Figure 6D:
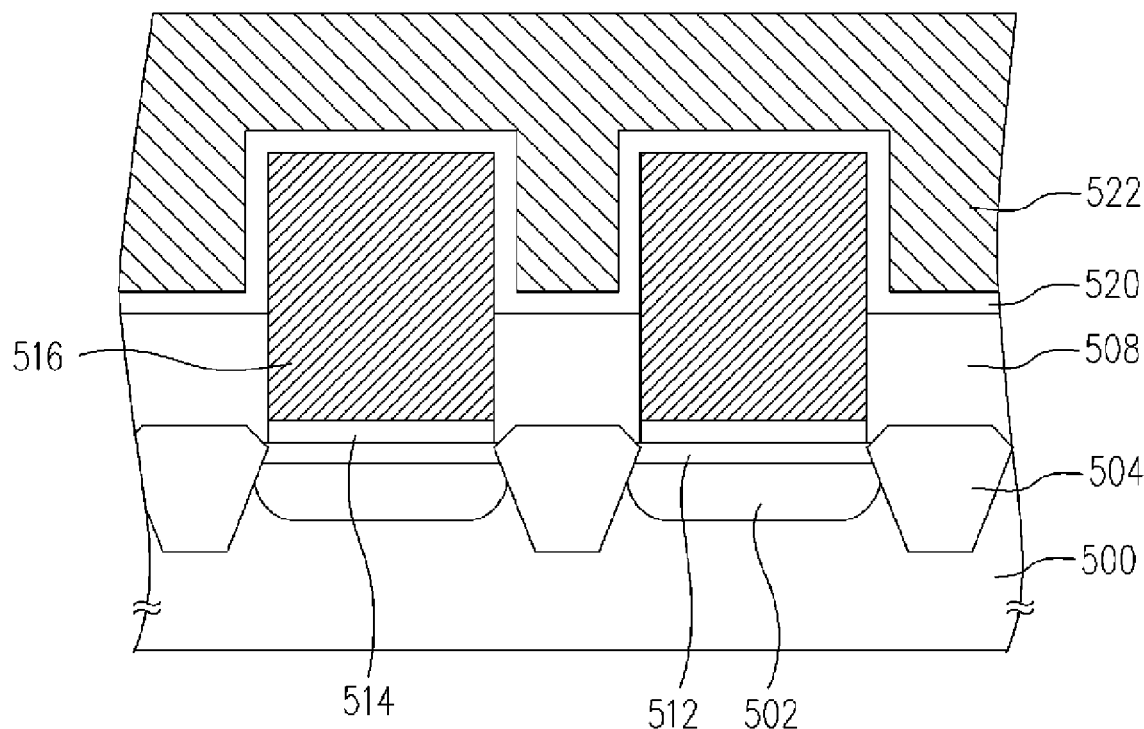

As shown in FIGS. 5D and 6D, an inter-gate dielectric layer 520 is formed over the patterned film layer 508 to cover the floating gates 516. The inter-gate dielectric layer 520 is an oxide/nitride/oxide composite layer, an oxide/nitride composite layer or a silicon oxide layer formed in a lower-pressure chemical vapor deposition (LPCVD) process, for example. Thereafter, control gates 522 are formed over the inter-gate dielectric layer 520. The control gates 522 are oriented in a direction parallel to each other (as shown in FIG. 4) and used as word lines of the flash memory cells in a subsequent operation. Furthermore, the control gates 522 covers the inter-gate dielectric layer 520 above the floating gates 516 as well as on the sidewalls of the floating gates 516. Moreover, if the n-type substrate 500 has device isolation structures 504 thereon, the control gates 522 cross over the linear device isolation structures 504. Preferably, the control gates 522 are aligned in a direction perpendicular to the device isolation structures 504 as shown in FIG. 4.

Figure 8:
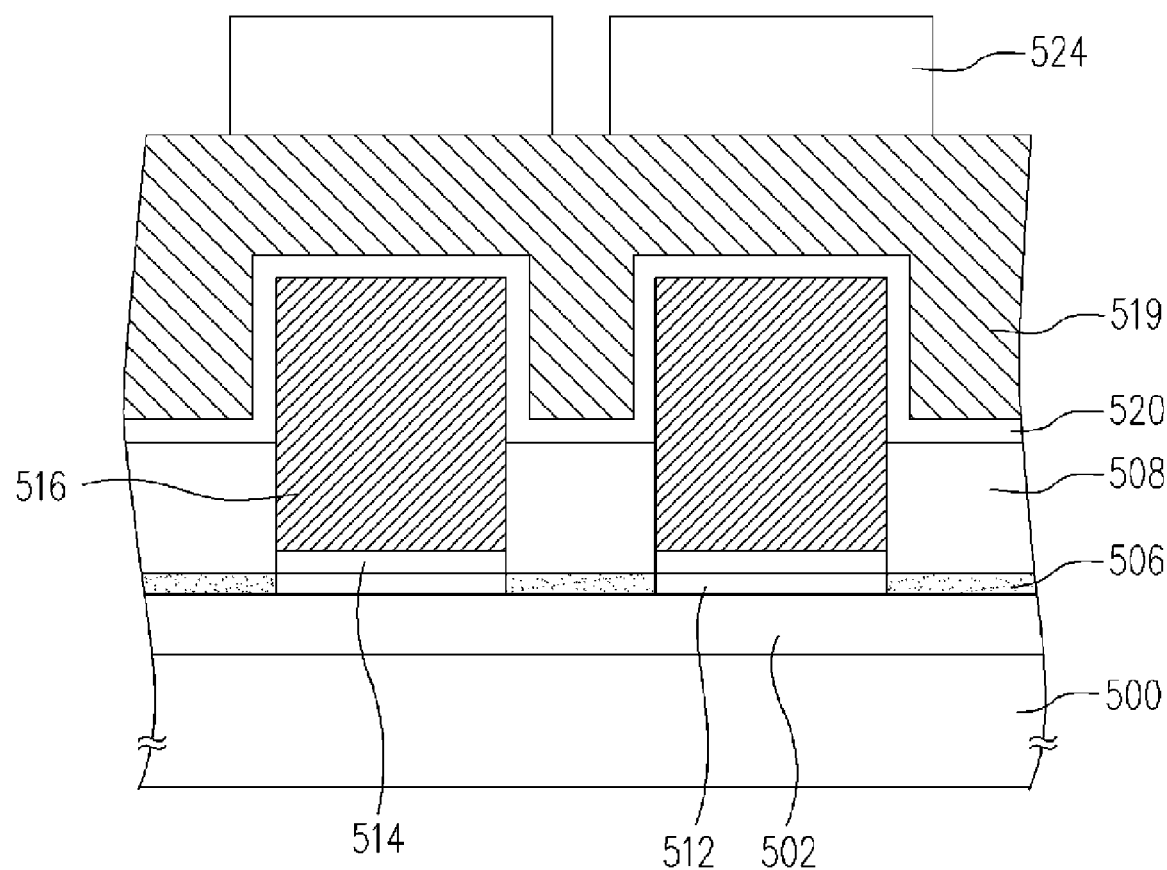
FIGS. 8 and 9 are schematic cross-sectional views along line I–I' and II–II' of FIG. 4 showing the steps for fabricating the control gate of the flash memory cell according to the present invention.
Figure 9:
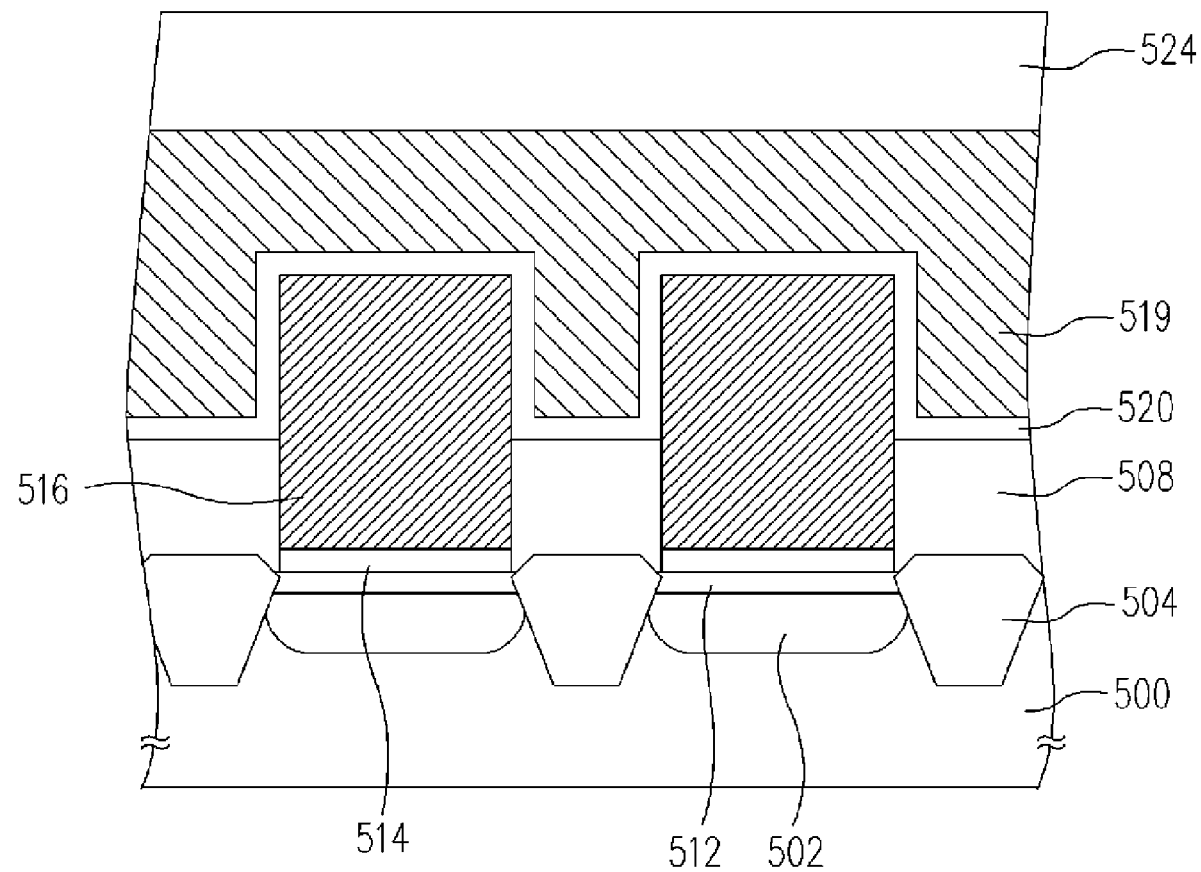

FIGS. 8 and 9 are schematic cross-sectional views along line I–I' and II–II' of FIG. 4 showing the steps for fabricating the control gate of the flash memory cell according to the present invention. As shown in FIGS. 8 and 9, the control gate 522 is formed by depositing a conductive material such as doped polysilicon over the inter-gate dielectric layer 520 to form a conductive layer 519 in a chemical vapor deposition process, for example. Thereafter, a patterned photoresist layer 524 is formed over the conductive layer 519 covering the floating gates 516. The patterned photoresist layer 524 includes a plurality of parallel-orientated linear patterns formed in a photolithographic process, for example. Using the patterned photoresist layer 524 as a mask, an etching operation is carried out to remove a portion of the conductive layer 519. After that, the patterned photoresist layer 524 is removed to expose the plurality of linear control gates 522 on the inter-gate dielectric layer 520 as shown in FIGS. 5D and 6D. Thus, the fabrication of a flash memory cell 530 is complete. Since subsequent processing steps for producing a complete flash memory should be familiar to those skilled in the art of semiconductor fabrication, a detailed description of those steps is omitted.

Figure 10:
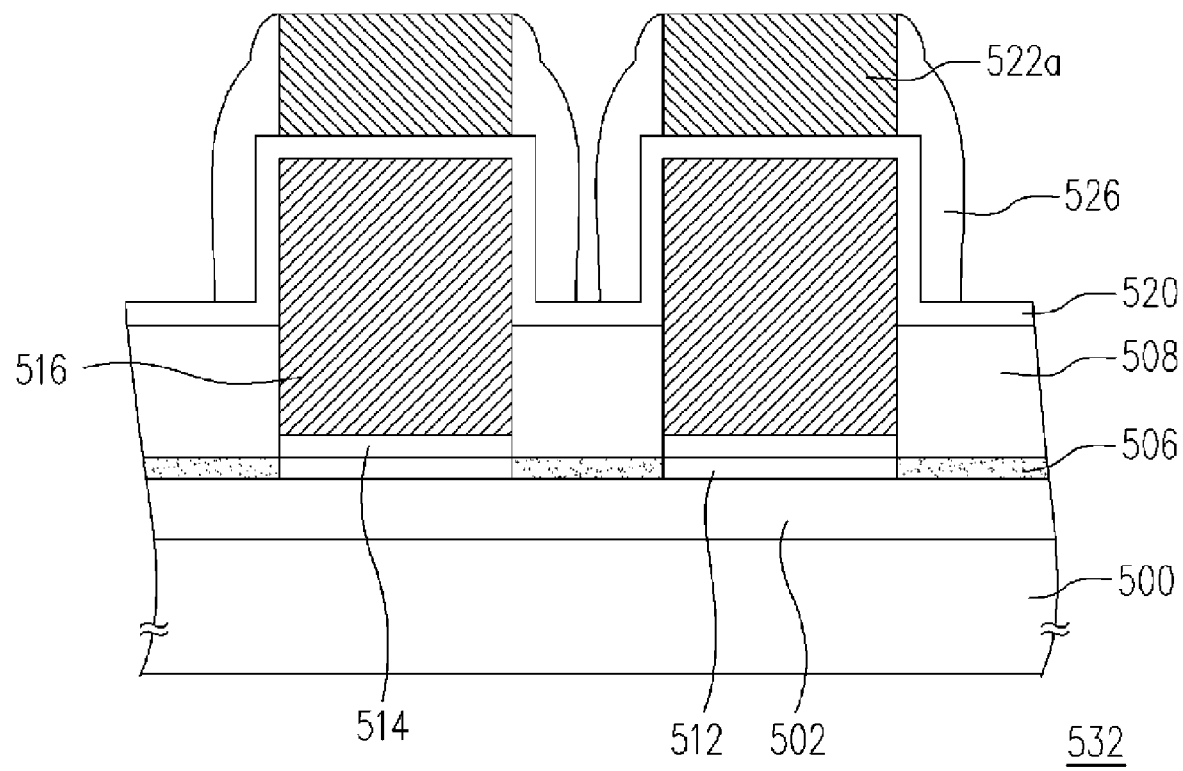
FIG. 10 is a schematic cross-sectional view of an alternative flash memory cell according to the present invention.

In another embodiment of the present invention, the control gate 522a of the flash memory cell can be disposed directly above the floating gate 51 6 but without covering the sidewalls of the floating gate 516 as shown in FIG. 10. To increase the coupling ratio of the flash memory cell in this case, spacers 516 are formed on the sidewalls of the control gates 522a. Specifically, the spacers 526 are fabricated using a conductive material, preferably the same type of material as the control gates 522a such as polysilicon. Hence, the control gates 522a and the spacers 526 are electrically connected together. The method of producing the spacers 526 on the flash memory cell 532 includes, for example, forming a conformal conductive layer (not shown) over the substrate to cover the inter-gate dielectric layer 520 and the control gates 522a and etching back the conductive material layer. After forming the flash memory cell 532, other conventional processes for forming a memory device are carried out.

Figure 11A:
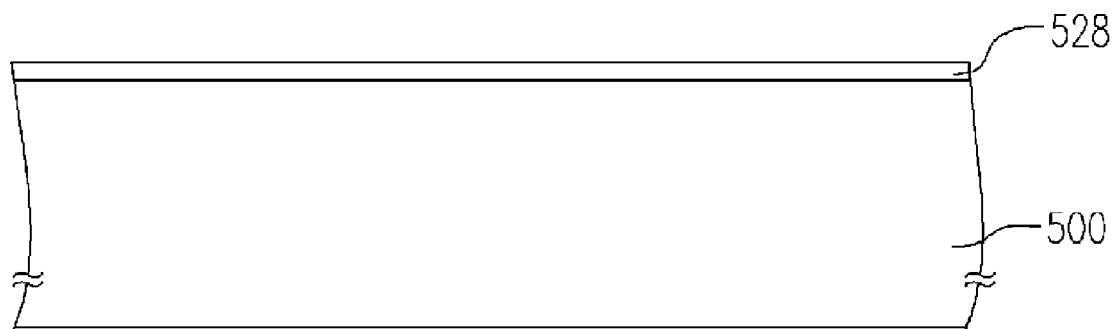
FIGS. 11A through 11C are schematic cross-sectional views along line I–I' of FIG. 4 showing the steps for fabricating an alternative flash memory cell according to the present invention.
Figure 11B:
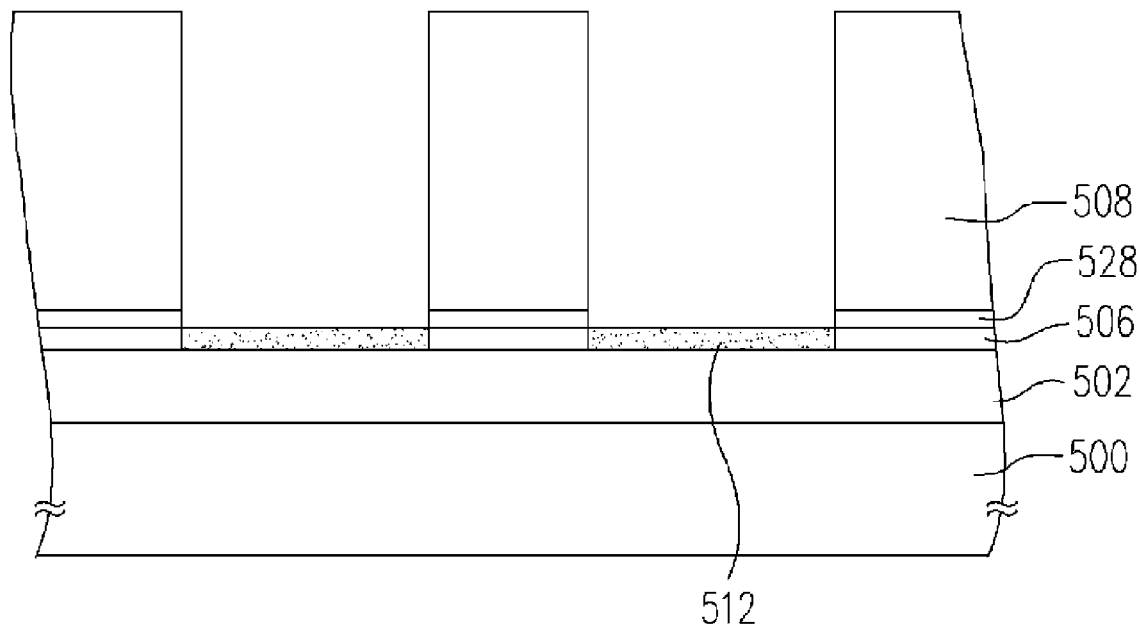
Figure 11C:
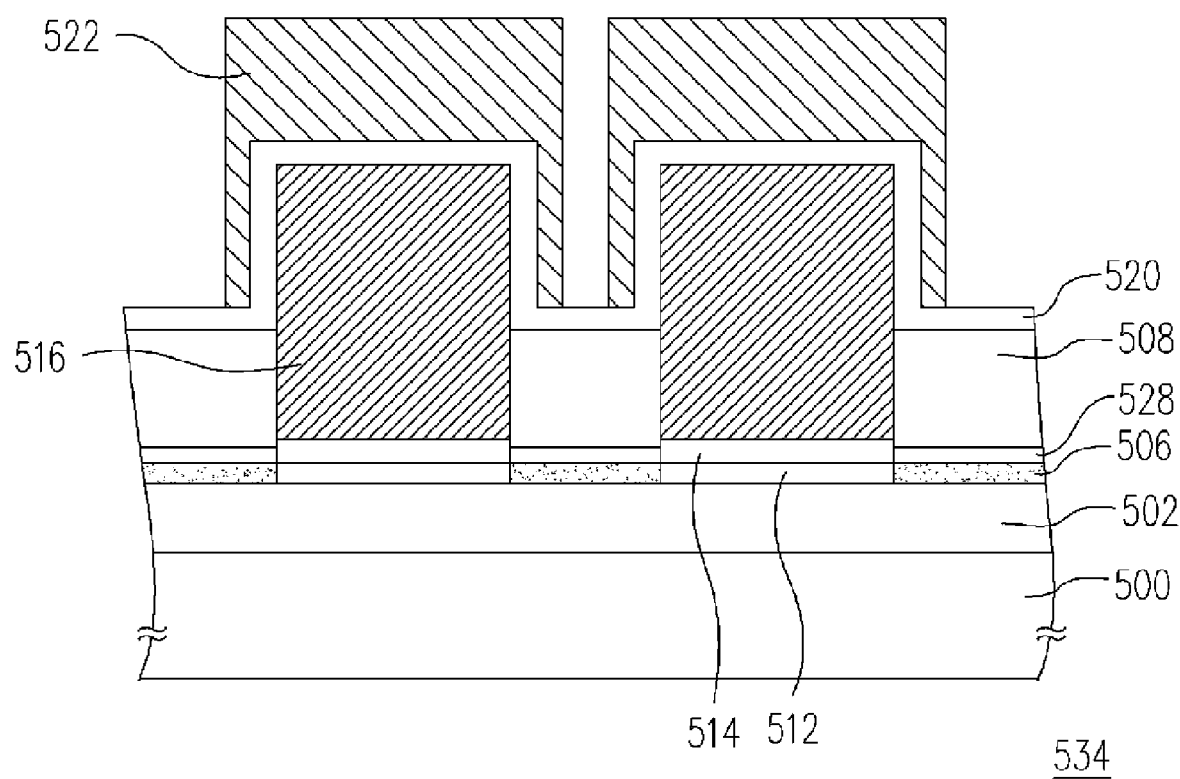
Figure 12A:
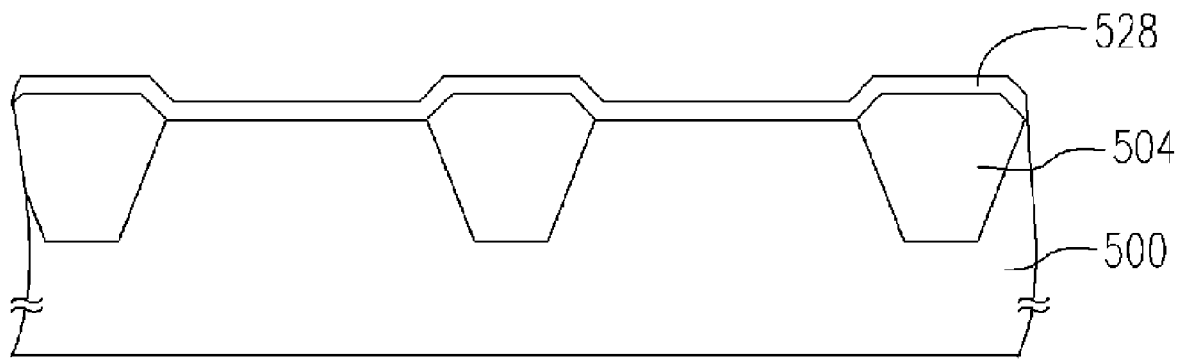
FIGS. 12A through 12C are schematic cross-sectional views along line II–II' of FIG. 4, which also correspond to FIGS. 11A through 11C, showing the steps for fabricating an alternative flash memory cell according to the present invention.
Figure 12B:
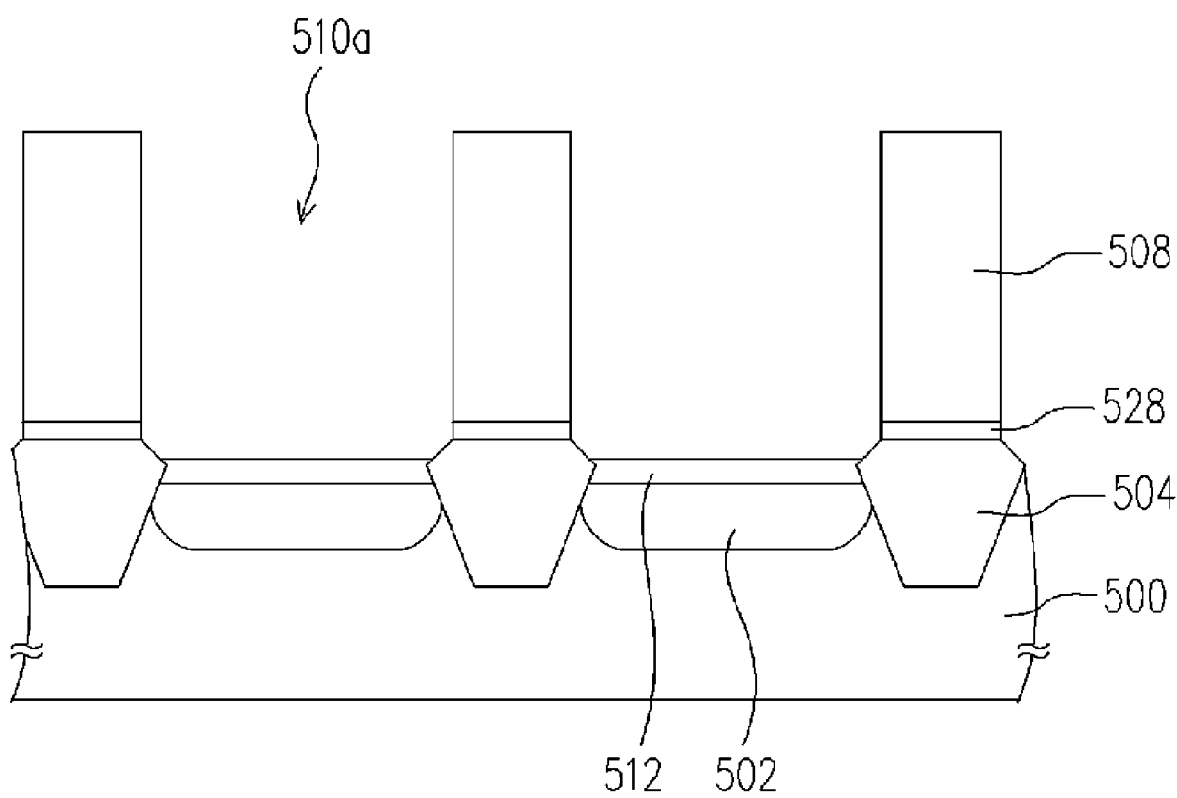
Figure 12C:
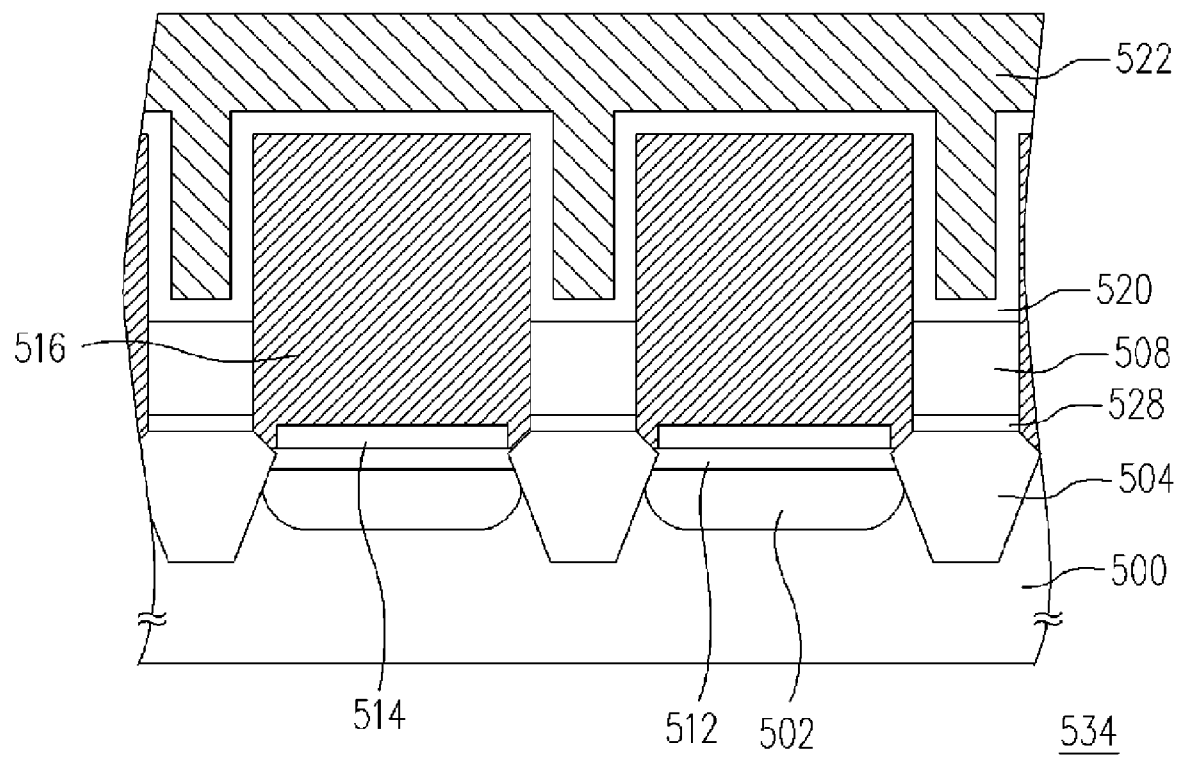

In yet another embodiment of the present invention, a sacrificial layer 528 (as shown in FIGS. 11A and 12A) is formed over the n-type substrate 500 after forming the device isolation structures 504 but before forming the p-type well 502. The sacrificial layer 528 protects the n-type substrate 500 and the device isolation structures 504 against possible damages in a subsequent process (for example, an etching process). For example, as shown in FIGS. 11B and 12B, the method of forming the patterned film layer 508 includes performing a photolithographic and etching process to form openings 510a in a material layer (not shown). The sacrificial layer 528 serves as an etching stop layer to prevent the over-etching of the n-type substrate 500 and the device isolation structures 504 when the patterned film layer 508 is etched to form the openings 510a. With the n-type substrate 500 and the device isolation structures 504 protected against etching, device leakage problems can be significantly subdued. Thereafter, a portion of the sacrificial layer 528 is removed to expose a portion of the n-type substrate 500 and the device isolation structures 504. After that, the aforementioned steps are carried out to form a flash memory cell 534 as shown in FIGS. 11C and 12C.

In the following, the structure of a flash memory cell according to the present invention is illustrated using FIGS. 5D and 6D. Since the materials constituting various film layers have already been described, detailed description in this area is omitted.

As shown in FIGS. 5D and 6D, the flash memory cell 530 of the present invention mainly includes an n-type substrate 500, a plurality of linear device isolation structures 504, an n-type doped region 506, a patterned film layer 508, a p-type doped region 512, a tunneling dielectric layer 514, a plurality of floating gates 516, an inter-gate dielectric layer 520 and a plurality of linear control gates 522. The n-type substrate 500 has a p-type well 502 already formed therein. The n-type doped region 506 is disposed in the n-type substrate 500 within the p-type well 502 to serve as a source/drain region of the flash memory cell 530 in a subsequent operation. The patterned film layer 508 is disposed on the n-type substrate 500 while the p-type doped region 512 is disposed on a portion of the n-type substrate exposed by the patterned film layer 508 to serve as a channel region of the flash memory cell 530. The tunneling dielectric layer 514 is disposed on the n-type substrate 500 above the p-type doped region 512.

The floating gates 516 are disposed on the tunneling dielectric layer 514. The floating gates 516 have a thickness greater than the patterned film layer 508. In one embodiment, the floating gate 516 has a thickness of about 5000 Å and the patterned film layer 508 has a thickness between about 1500 Å to 2000 Å. The inter-gate dielectric layer 520 is disposed over the patterned film layer 508 to cover the floating gates 516. The control gates 522 are disposed on the inter-gate dielectric layer 520 and orientated in parallel with each other to cover the floating gates 516 and its sidewalls.

In another embodiment of the present invention, the control gates 522a (refer to FIG. 10) are disposed directly above the respective floating gates 516. In other words, each control gate 522a does not cover the sidewalls of the floating gate 516, and spacers 526 are disposed on the sidewalls of the control gates 522a and the floating gates 516 as shown in FIG. 10. The spacers 526 are fabricated using a conductive material. In one embodiment, the spacers 526 are fabricated using polysilicon, for example.

In yet another embodiment of the present invention, a sacrificial layer 528 (as shown in FIGS. 11C and 12C) is disposed between the patterned film layer 508 and the n-type substrate 500. The sacrificial layer 528 protects the n-type substrate 500 and the device isolation structures 504 against possible damages in other process (for example, an etching process). In addition, in this present embodiment, the floating gates 516 are disposed on the tunneling dielectric layer 514. The floating gates 516 also have short extensions that run over a portion of the device isolation structures 504 as shown in FIG. 12C.

The method of fabricating the flash memory cell according to the present invention includes forming a patterned film layer with openings on a substrate and filling the openings with a conductive material to form a plurality of floating gates. Since the floating gate of the flash memory cell is not form through an etching operation, the large aspect ratio of the openings no longer presents a problem in manufacturing. Furthermore, a sacrificial layer is also formed over the substrate in another embodiment of the present invention for protecting the substrate and the device isolation structures against possible damages in the process of etching the patterned film layer. Thus, the present invention also minimizes device leakage problems due to over-etching. In other words, the present invention not only removes some of the difficulties in fabricating the flash memory cell, but also increases overall reliability of the memory device.

In addition, the degree of overlapping between the control gate and the floating gate can be adjusted by varying the thickness of the floating gate above the patterned film layer. Hence, the flash memory cell can have an optimal coupling ratio for increasing the data accessing and erasing rate of the flash memory cells.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory cell, comprising:
   a first conductive type substrate;
   a plurality of device isolation structures disposed in the first conductive type substrate to define a plurality of active regions;
   a second conductive type well disposed in the first conductive type substrate;
   a patterned film layer disposed on the first conductive type substrate, wherein the patterned film layer has a plurality of openings that exposes a portion of the first conductive type substrate within the active regions;
   a plurality of floating gates disposed inside the openings and extended over a portion of the device isolation structures, wherein the floating gate has a thickness greater than that of the patterned film layer;
   a tunneling dielectric layer disposed between the floating gates and the first conductive type substrate;
   a plurality of control gates disposed over the floating gates;
   an inter-gate dielectric layer disposed between the floating gates and the control gates; and
   a first conductive type doped region disposed in the first conductive type substrate within the active region on each side of the control gates.

2. The flash memory cell of claim 1, wherein the flash memory cell further comprises a second conductive type doped region disposed in the first conductive type substrate exposed by the patterned film layer such that the second conductive type doped region has a dopant concentration different from that of the second conductive type well.

3. The flash memory cell of claim 1, wherein each control gate stacks on top of a corresponding floating gate and the flash memory cell further comprises conductive spacers disposed onto sidewalls of the control gates and the floating gates.

4. The flash memory cell of claim 3, wherein the material constituting the conductive spacers comprises doped polysilicon.

5. The flash memory cell of claim 1, wherein the flash memory cell further comprises a sacrificial layer disposed underneath the patterned film layer.

6. The flash memory cell of claim 5, wherein there is an etching selectivity between the material constituting the sacrificial layer and the material constituting the patterned film layer and the device isolation structures.

7. The flash memory cell of claim 1, wherein each control gate overlaps with the upper surface and the sidewalls of a corresponding floating gate.

8. The flash memory cell of claim 1, wherein there is an etching selectivity between the material constituting the floating gates and the material constituting the patterned film layer.

9. The flash memory cell of claim 1, wherein the material constituting the floating gate comprises doped polysilicon.

10. The flash memory cell of claim 1, wherein the material constituting the patterned film layer comprises silicon oxide.

11. A flash memory cell, comprising:
   a first conductive type substrate;
   a second conductive type well formed in the first conductive type substrate;
   a patterned film layer disposed over a portion of the first conductive type substrate;

a tunneling dielectric layer disposed over the first conductive type substrate exposed by the patterned film layer;

a plurality of floating gates disposed over the tunneling dielectric layer such that the floating gates have a thickness greater then tat of the patterned film layer, an inter-gate dielectric layer disposed over the patterned film layer to cover the floating gates;

a plurality of control gates disposed over the inter-gate dielectric layer such that each control gate overlaps with the upper surface and the sidewalls of a corresponding floating gate; and a first conductive type doped region disposed in the first conductive type substrate within the active region on each side of the control gates.

12. The flash memory cell of claim 11, wherein the flash memory cell further comprises a second conductive type doped region disposed in the first conductive type substrate exposed by the patterned film layer and the second conductive type doped region has a dopant concentration different from the second conductive type well.

13. The flash memory cell of claim 11, wherein there is an etching selectivity between the material constituting the floating gate and the material constituting the patterned film layer.

14. The flash memory cell of claim 11, wherein the material comprising the floating gate comprises doped polysilicon.

15. The flash memory cell of claim 11, wherein the material constituting the patterned film layer comprises silicon oxide.

* * * * *